(12) United States Patent
Ito et al.

(10) Patent No.: US 7,875,858 B2
(45) Date of Patent: Jan. 25, 2011

(54) CHARGED PARTICLE BEAM TRAJECTORY CORRECTOR AND CHARGED PARTICLE BEAM APPARATUS

(75) Inventors: Hiroyuki Ito, Hitachinaka (JP); Yuko Sasaki, Mito (JP); Ryoichi Ishii, Hitachinaka (JP); Takashi Doi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 215 days.

(21) Appl. No.: 12/349,708

(22) Filed: Jan. 7, 2009

(65) Prior Publication Data
US 2009/0173887 A1  Jul. 9, 2009

(30) Foreign Application Priority Data
Jan. 9, 2008  (JP)  ............................. 2008-002489

(51) Int. Cl.
 *H01J 1/50* (2006.01)
 *G21K 1/08* (2006.01)
 *G21K 1/093* (2006.01)
(52) U.S. Cl. .......................... 250/396 ML; 250/396 R; 250/492.1; 250/492.3
(58) Field of Classification Search ................ 250/306, 250/307, 309, 310, 311, 492.1, 492.3, 396 R, 250/397, 396 ML; 430/296
See application file for complete search history.

(56) References Cited

U.S. PATENT DOCUMENTS 3,100,260 A * 8/1963 Wilska .................. 250/396 R
6,441,384 B1  8/2002 Kojima
2008/0116391 A1* 5/2008 Ito et al. ............... 250/396 ML
2008/0230711 A1* 9/2008 Platzgummer et al. .. 250/396 R

FOREIGN PATENT DOCUMENTS

JP  2000-012454 A  1/2000
JP  2006-080155 A  3/2006

OTHER PUBLICATIONS

Rose, H., "Outline of an ultracorrector compensating for all primary chromatic and geometrical aberrations of charged-particle lenses," Nuclear Instruments and Methods in Physics Research, Section A, 519, pp. 12-27 (2004).
Stickel, W. et al., "Evolution of electron projection optics from variable axis immersion lenses to projection reduction exposure with variable axis immersion lenses," J. Vac. Sci. Technol. B 20(6), Nov./ Dec. 2002.

* cited by examiner

*Primary Examiner*—Jack I Berman
*Assistant Examiner*—Nicole Ippolito Rausch
(74) *Attorney, Agent, or Firm*—McDermott Will & Emery LLP

(57) ABSTRACT

The invention relates to a trajectory correction method for a charged particle beam, and provides a low-cost, high accuracy and high-resolution converging optical system for use with a charged particle beam to solve problems with conventional aberration correction systems. To this end, the present invention uses a configuration which forms electromagnetic field which is concentrated towards a center of a beam trajectory axis, causes oblique of the beam to make use of lens effects and bend the trajectory, and consequently, cancels out large external side non-linear effects such a spherical aberration of the electron lens. Specifically, the configuration generates an electric field concentration in a simple manner by providing electrodes above the axis and applying voltages to the electrodes. Further, the above configuration can be realized trough operations using lenses and deflectors with incident axes and image formation positions that are normal.

14 Claims, 8 Drawing Sheets

CHARGED PARTICLE BEAM TRAJECTORY CORRECTOR AND CHARGED PARTICLE BEAM APPARATUS

BACKGROUND OF THE INVENTION

1. Field of the Invention

The invention relates to a trajectory corrector in a charged particle beam optical system and to a charged particle beam apparatus, such as an electron microscope, which includes the charged particle beam apparatus.

2. Background Art

Charged particle beam apparatuses fulfill important roles across the broad nanotechnology field. Such apparatuses include scanning electron microscopes (SEM) which converge electrons and scan a surface, detect signal electrons from the specimen surface and convert the signal electrons to a visible image on an image display apparatus, transmission electron microscopes which form images from electrons scattered by a specimen using an electron lens, electron beam exposure devices which irradiate a specimen surface with an electron beam to form patterns, and Focused Ion Beam (FIB) apparatuses which perform processing by irradiating a specimen with a focused ion beam. To bring the charged particle beams into convergence, electron lenses constructed from electrodes or magnetic poles which generally have rotational symmetry are used for reasons of controllability and fabrication properties.

One problem which occurs in such electron lens systems is electron optical aberration. For instance, magnetic-field type lenses with rotational symmetry have large convergence effects due to increased magnetic field strength on an off-axis side in proximity to the magnetic pole, and therefore function as convex lenses. Moreover, aberration that is a high-order perturbation component of the lens causes a phenomenon in which charged particle beams emitted from a given point diverge in a manner dependent on conditions of incidence of the beam to the lens, and do not converge to a point. Hence, even when an ideal point source is used, a finite spread dependent on a radiation angle distribution or a central trajectory axis of the point source occurs at image-formation point, in what is known as beam defocusing. Thus, aberration causes deterioration in resolution when observing a specimen using a converged charged particle beam or a serious deterioration in accuracy in micro-fabrication.

According to perturbation aberration theory, it is known that, due to the occurrence of spherical aberration proportional to the third power of an incident angle $\alpha$ of a beam and chromatic aberration proportional to a deviation dV relative to accelerating energy V, an amount $\delta$ of departure of a beam trajectory on the axis can be expressed as:

$$\delta = Cs\alpha^3 + Cc\Delta V/V + \quad (1)$$

where Cs denotes a spherical aberration coefficient and Cc denotes a chromatic aberration coefficient. Other contributions are generated off the axis. For $\alpha$-dependent beam current distribution or energy dispersion, beam defocusing occurs in accordance with the above formula. Generally, charged particle beam apparatus requires a large current in order to increase the signal size or micro-fabrication speed, and has to capture, across a wide angle, the charged particle beam generated by a charged particle source. As a result, the trajectory distribution within the convergent lens is widened in a trade-off for an increase in the amount of aberration. This trade-off defines the performance of the lens.

Various methods for correcting the aberration have been proposed. The methods include a multipole aberration correction system that involves controlling the divergence and convergence using a multi-stage arrangement of regularly partitioned multipoles (see "Outline of an ultracorrector compensating for all primary chromatic and geometrical aberrations of charged-particle lenses", H. Rose, Nuclear Instruments and Methods in Physics Research, Section A, 519, 12-27 (2004)), and a multi-beam method that involves disposing a microlens array, splitting the charged particle beam into multiple beams, and performing a trajectory correction on the beams (see JP Patent Publication (Kokai) No. 2006-80155A). Also included is an annular illumination method that involves disposing an annular limiting aperture on the axis with the aim of inhibiting aberration to some extent under a large current and, in particular, lessening the space-charge effect resulting from Coulomb repulsion or scattering within a beam (see JP Patent Publication (Kokai) No. 2000-12454A). An increase in the intensity of the charged particle beam increases the contribution made to the space charge by electrons present on the maximum intensity axis where current density is high. Thus, the concept of the above method is to use an annular of aperture of axis-symmetrical configuration to capture a peripheral electron rather than capture the charged particle beam circularly about the axis, and thereby increase the intensity of an electron source and hence an effective area for beam capture. An annular lens system in which an electrode is placed on the axis, and the charged beam is limited to an annular region to entry to the lens (see U.S. Pat. No. 3,100,260).

SUMMARY OF THE INVENTION

Multipole systems and multi-beam systems require extremely accurate machine fabrication, positioning, power sources and adjustment method and are therefore expensive and technologically difficult to implement. As such, these systems are still only used in a certain portion of electron microscopes and the like. The annular illumination method is also capable of reducing aberration to a certain extent and increased currents can be anticipated. However, the method has a problem in that aberration-limited off-axis trajectories are captured, and consequently it is not possible to increase acquired current by large amounts, especially in regions where the space-charge effect is not dominant. Moreover, although the annular lens system allows simply some degree of trajectory correction, there are associated technological problems, such as high-order electric field distortion, effects of parasitic aberration, and difficulty in making adjustments. Thus, for charged particle beam convergence, it is necessary to reduce an amount of aberration. This has been an important problem.

More specifically, the rotationally symmetrical magnetic potential $\phi$ can be subjected to a Taylor expansion using an on-axis potential $\Phi$, to give the following:

$$\phi(r,z) = \Phi(z) - (1/4)\Phi(z)''r^2 + (1/64)\Phi(z)''''r^4 + \quad (2)$$

where (r, z, $\theta$) are polar coordinates based at the axis of rotational symmetry. Here, the differential values of magnetic potential, specifically the third and subsequent terms for which the magnetic field B is non-linear are aberration terms. In particular, the third term, which is proportional to the axis separation $r^3$, represents $3^{rd}$-order spherical aberration.

With a coaxial infinitely-long cylindrical electrode having internal and external dimension of a and b as the annular electrode, formulas for the electric field E can be solved analytically to give $$E(r) = V/r \log(a/b) \quad (3).$$

From Formula (3), it is clear that the differential of the potential, which is the electric field E, is proportional to 1/r and that the electric field E therefore increases steeply towards the central axis. Further, as the axis is approached, the effect of higher order terms in the Formula (2) increases in a relationship which is inversely proportional to r. Thus, by skillfully using these effects to cancel each other out, it is possible to correct aberration using a coaxially arranged annular electrode in a rotationally symmetrical magnetic lens.

However, in conventional coaxial annular electrode, since a very strong deflecting electric field is formed in proximity to the axial electrode according to Formula (2), the electric field distortion is large and the beam incidence angle is restricted. Further, an annular limiting aperture and a supporting portion to support the axial electrode are required in proximity to the beam. These components may be charged as a result of contamination, and thereby introduce the risk of destabilizing the trajectories and causing high-order parasitic aberration. These restrictions and risks are the cause of the above-described difficulty in making adjustments.

The invention was conceived after closely studying the above-described circumstances and solves the problems of conventional aberration correction systems, providing a low-cost, high-accuracy, and high-resolution converging optical system for use with a charged particle beam.

To solve the above problems, a beam trajectory is given a curved form by rotationally symmetrical, multi-stage, coaxial correction electrodes. Specifically, charged particle beams are caused to form an image on an axis of rotational symmetry and thus to cross obliquely. Rotationally symmetrical axial and off-axis electrodes are provided in multiple stages at intervals along the beam trajectory. With this arrangement, a balance is produced by relaxing the concentrated electric field distortion generated, for instance, at the ends of the electrodes and compounding the actions of an externally provided magnetic lens, and the overall aberration is canceled out. Here, from the theory of symmetry in optical system, it is known to be sufficient to form an aberration-free image on an axis with the rotation direction trajectory and analyze the aberration of the off-axis direction (radial direction) trajectory.

(1) More specifically, the charged particle beam trajectory corrector according to the present invention includes a correction electrode group including an axial electrode provided on a straight-line axis which obliquely crosses an emission axis of the charged particle beam from the illumination lens, and off-axis electrodes provided with rotational symmetry so as to surround the axial electrode; and a magnetic lens which generates an electric field between the axial electrode and the off-axis electrodes. The charged particle beam is caused to obliquely intersect the straight-line axis, a voltage is applied between the axial electrode and the off-axis electrodes to relax electric field distortion, and the aberration by an action of the magnetic lens is corrected. Further, an intersection point of the emission axis of the charged particle beam and the straight-line axis matches an image-formation point of the illumination lens.

For example, the off-axis electrodes may be configured as an off-axis electrode group which includes a plurality of off-axis electrodes, and voltage values proportional to a voltage input value to a predetermined off-axis electrode of the plurality of off-axis electrodes may be inputted to the other off-axis electrodes of the plurality of off-axis electrodes.

Further, the magnetic lens may be compounded so as to be a rotation target that is coaxial with the straight-line axis on which the axial electrode of the correction electrodes is provided. Input values of the correction electrodes may be controlled with a linear function of input values to the magnetic lens.

Further, the corrector may include a supporting body to which is fixed one end of the axial electrode and the off-axis electrodes. Then, the axial electrode is configured as a short rod-like electrode or a substantially point-like electrode surrounded by a ground-connected shield electrode. The supporting body may have an annular opening which limits an incident range of the charged particle beam to a periphery of a portion fixed to an end of the rod-like electrode.

The off-axis electrodes may be divided in a circumferential direction to form a plurality of portion electrode, and voltages may be independently applied to the each portion electrode.

The above-described corrector further includes a movable limiting aperture having differing opening dimensions in a radial direction and a rotation direction from a center of an axis of rotational symmetry of the off-axis electrodes.

The above-described corrector may further include an incident astigmatism corrector for correcting convergence towards a radial direction and a rotation direction from a center of an axis of rotational symmetry of an incident charged particle beam; and an emission astigmatism corrector which restores a shape of the charged particle beam emitted from the correction electrodes.

(2) The charged particle beam apparatus according to the present invention includes: a charged particle source which generates the charged particle beam; an illumination lens for converging the charged particle beam; a charged particle beam trajectory corrector for modifying a trajectory of the charged particle beam to correct aberration; a corrector having the above-described characteristics, an illumination deflector for illuminating a specimen with a modified-trajectory charged particle beam; and an image generating and processing unit which detects a reflected electron signal from the specimen and displays an image on an image display apparatus.

Here, the illumination deflector corrects an incident direction of the charged particle beam.

The illumination deflector further includes a function for scanning an upper structure of the correction electrodes, and the image generating and processing unit detects a reflected electron signal from the upper structure of the correction electrodes, generates images of the upper structure of the correction electrodes, and displays the images on the image display apparatus.

The charged particle beam apparatus further includes a control unit which controls input voltage values of the correction electrodes with a linear function of input to the illumination deflector.

The charged particle beam apparatus further includes a control unit which controls the illumination deflector by measuring shape distortion of an emission beam with respect to a plurality of input values to the illumination deflector, approximating the distortion amounts as a polynomial function, and computing from the polynomial function an input value to the illumination deflector to minimize the distortion amount.

Further characteristic of the invention will become clear from the following preferred embodiments of the invention and the accompanying drawings.

According to the present invention, a wide-use aberration correction method can be provided at low cost with an apparatus that includes a power source and is extremely compact.

DETAILED DESCRIPTION OF THE PREFERRED EMBODIMENTS

Figure 1:
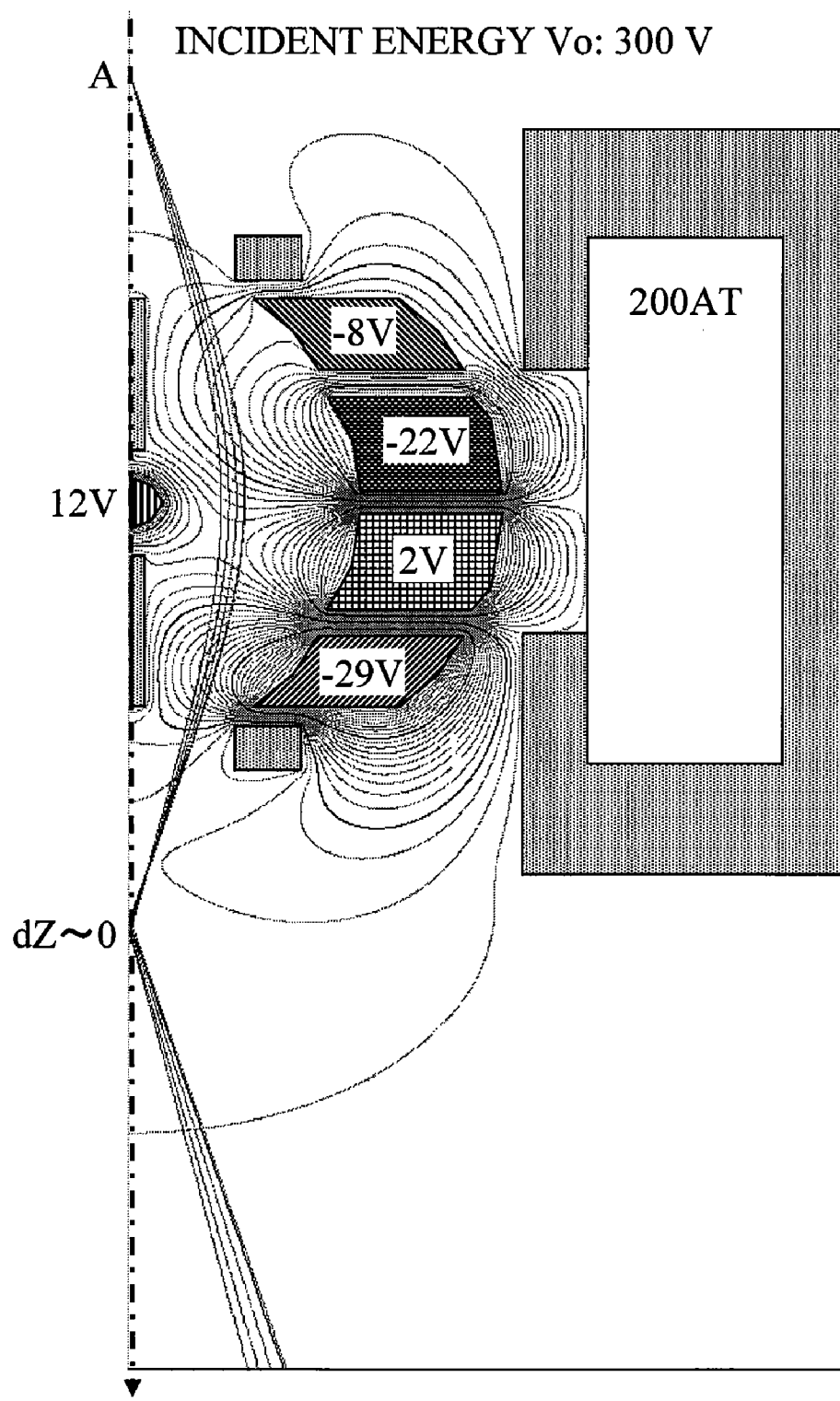
FIG. 1 is a view for explaining the principles of the invention.

The following describes embodiments of the invention with reference to the accompanying drawings. Note, however, that the embodiments are no more that examples for realizing the invention, and do not limit the technological scope of the present invention. Also, although the following describes cases in which the charged particles are electrons, the corrector of the invention can also used when the charged particles are ions. Note also that the common construction elements are denoted using the same reference numerals throughout the drawings.

Concept (Principle) of Spherical Aberration Correction

Figure 2:
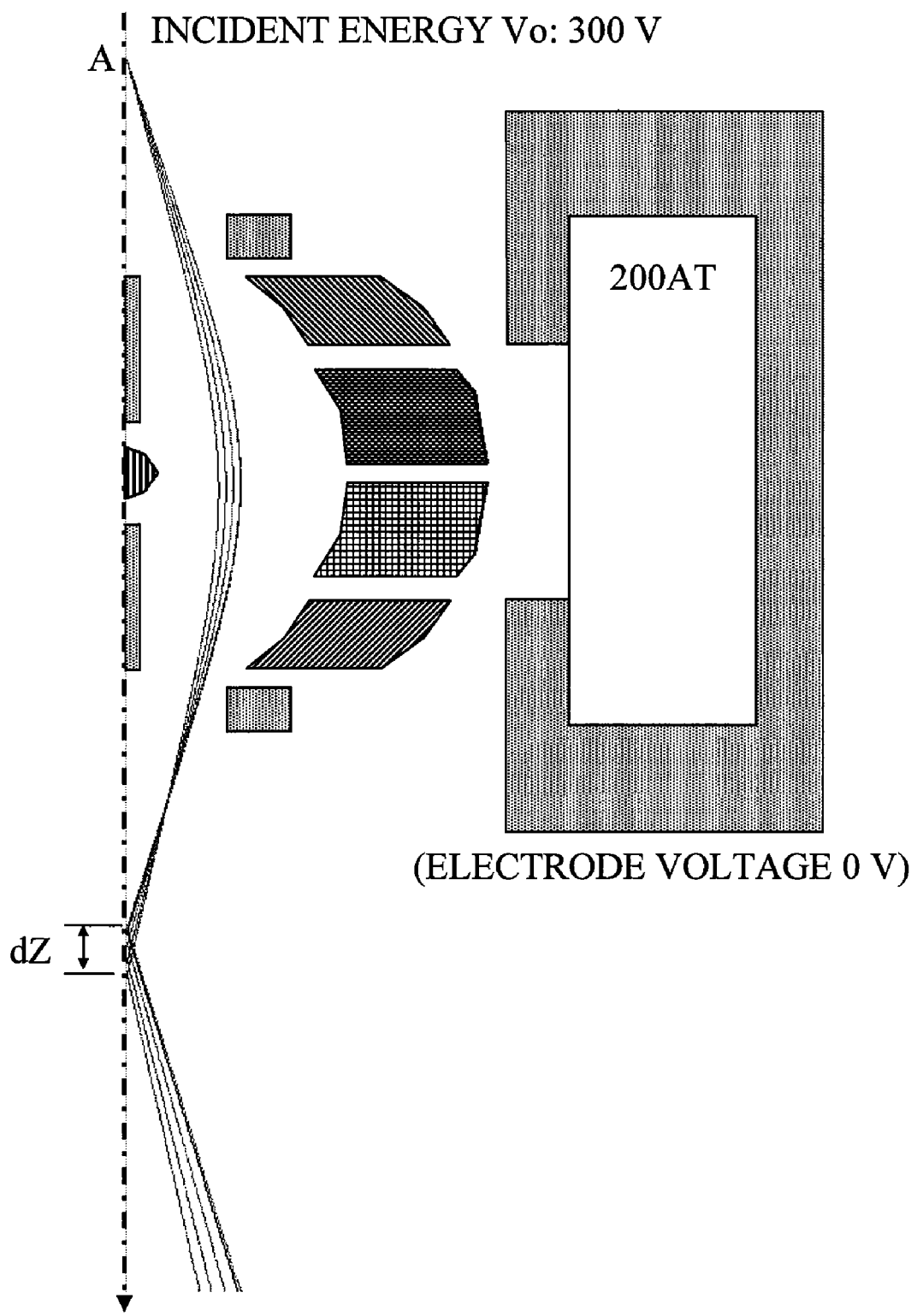
FIG. 2 is view for explaining disadvantages when (like in the conventional art), the beam trajectory is corrected without using correction electrodes.

First, the concept of spherical aberration correction is described with reference to FIG. 1 and FIG. 2. FIG. 1 and FIG. 2 show electron trajectories with an energy of 300 eV calculated from a central axis across semi-planar electrodes and a magnetic lens. FIG. 1 shows an example of adjusted converging conditions using correction electrodes made up of an axial point-like correction electrode and off-axis electrodes which are substantially aligned along the beam trajectory. The axial electrode has a supporting body which doubles as a ground electrode. The off-axis electrodes are arranged so as to be spread out along the beam trajectory. This arrangement suppresses the effect of electric field distortion in proximity to the electrode. The supporting body, in a sense, absorbs the electric force lines in proximity to the central electrode, and produces a shielding effect which relaxes a point charge field to a dipole field. It is also possible to reduce the distortion that results from electric field relaxation due to interaction among the plurality of axial electrodes.

FIG. 2, on the other hand, shows beam trajectories caused to converge without using correction electrodes by exciting a conventional magnetic lens with an excitation of 200 AT. From a comparison of the two configurations, it can be seen that while the beam emitted from point "A" in FIG. 2 spreads by dZ in the axial direction by the spherical aberration of the magnetic lens, the beam emitted from point "A" in FIG. 1 converges with a spread of 0 to dZ.

By using a single or plurality of rotationally symmetrical corrector groups which cause oblique incidence of the beam, it is possible to cancel out electron optical aberrations, to promote convergence/divergence of electrons pulled from the surface of a specimen, thereby supporting the adjustment of conditions of incidence to the detector, signal separation, and the like.

In recent years, MEMS (Micro-Electro-Mechanical Systems) fabrication techniques and machine fabrication techniques have progressed, and can be used to fabricate minute electron sources and electron lenses. From electron optical scaling law, it is known that the same beam trajectory can be obtained when electric fields are scaled down by scaling down the voltages and electrodes in an identical manner. Hence, by manufacturing a number of electrodes which are of the order of 10 μm in size using the above-mentioned microfabrication techniques, it is possible to finely control the beam trajectories with a low voltage source by simply exchanging the limiting aperture of the conventional art for the corrector of the invention.

Example Configuration of Correcting Optical System

Figure 3:
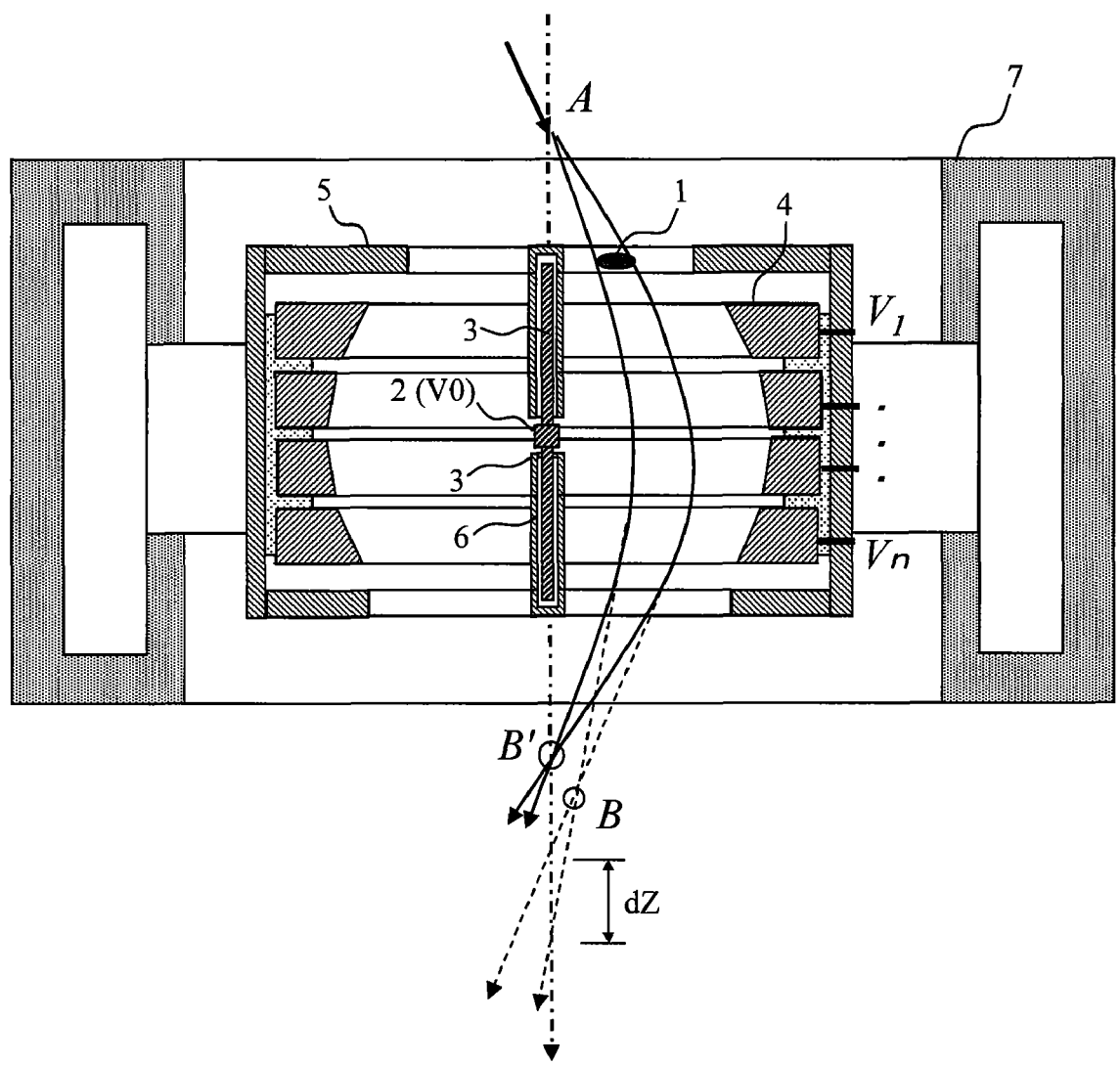
FIG. 3 is a cross-sectional view showing an example of an electric field-type corrector according to an embodiment.

FIG. 3 is a cross-sectional view showing an outline construction of a correcting optical system according to an embodiment of the invention. As shown in FIG. 3, an axial electrode 2 which includes a coaxial supporting body 3 and off-axis electrodes 4 are arranged with rotational symmetry in a magnetic lens 7. In this structure, the internal part of the supporting body 3 is supported by and forms part of a ground electrode 5, and forms a structure for applying a voltage Vo to the axial electrode 2 via an insulating portion 6. Each of the off-axis electrodes 4 is insulated from the ground electrodes 5, and a voltage Vn is applied to the $n^{th}$ off-axis electrode 4 from the top. Thus, the axial electrode 2 and the off-axis electrodes 4 are divided into a plurality of stages by multistage division or layering, enabling minute combination lens groups to be constructed.

Moreover, in the correcting optical system of FIG. 3, the electrode arrangement and adjustment are executed in the following procedure to obtain a desired beam trajectory. The first step of the procedure is to determine the form and excitation of the magnetic lens 7 by simulating the conditions for the desired beam trajectory while taking the inserted electrode arrangement into consideration. The second step is to place the correction electrodes as far as possible from the calculated beam trajectory in order to avoid electric field distortion. For instance, in FIG. 3, the off-axis electrodes 4 are arranged on a substantially rotationally symmetrical curved surface along the beam trajectory. In FIG. 3, two trajectories from the inner and outer parts of the beam 1 incident from the point "A" are shown. As described with reference to FIG. 2, when the magnetic lens 7 is used alone, the trajectories cross at the point "B" due to spherical aberration, causing a spread of dZ on the axis. Next, in a third step, the voltages of the correction electrodes are adjusted to correct the trajectories to the point "B'". When the corrected trajectory is displaced from the desired axial image-formation point, it is preferable to control so that the excitation adjustment of the magnetic lens 7 and the process to adjust the correction electrodes are repeated so that image formation takes place on the axis. From the focal point correcting voltages for various voltage values between the magnetic lens 7 and the electrodes or between the respective electrodes, it is possible to find in advance a linear relationship between voltage and image formation position on the axis (i.e. a sensitivity), and, through linked control simplify or automate adjustment. In FIG. 3 for instance, when a predetermined voltage is applied to a specific correction electrode (off-axis electrode 4), voltages proportional to the voltage inputted to the specific off-axis electrode are applied to the other electrodes. The input value of the correction electrodes may be controlled using a linear function of the input value to the magnetic lens 7. Note that since the optical system has rotational symmetry in the above example, estimates are also obtained relatively easily by simulation.

Figure 4:
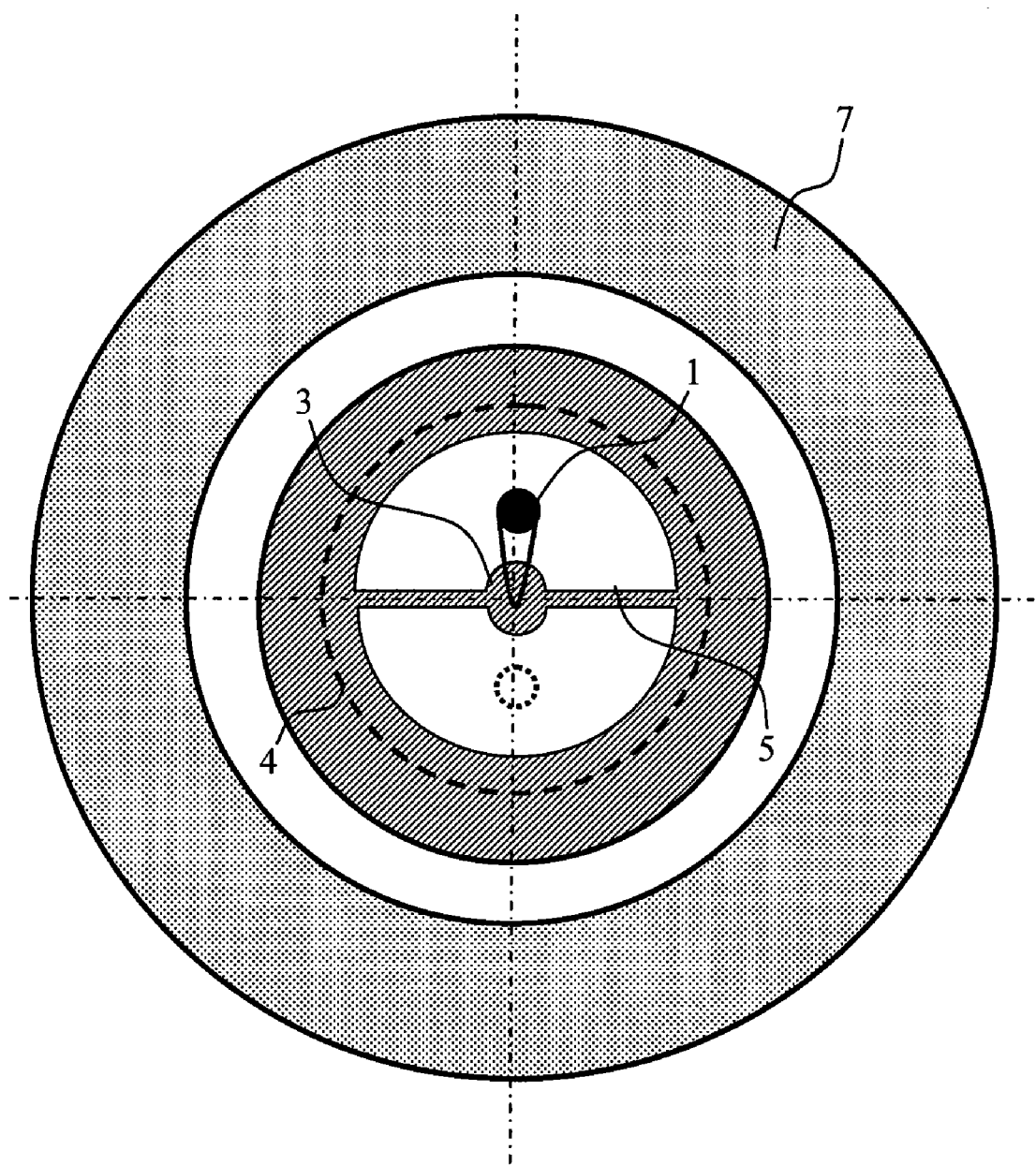
FIG. 4 is a plan view of the electric-field type corrector of FIG. 3.

FIG. 4 is a plan view showing the correcting optical system of FIG. 3 from the direction of incidence of the electron beam, and shows the case in which the beam 1 is incident on one side (upper portion of FIG. 4) of a beam introduction path. The upper portion of supporting body 3 is supported by a crossbar structure of the ground electrode 5 which crosses the center. With this structure, the beam 1 is passed through the central portion that is divided into equiangular portions so as to be as far as possible from the supporting body and the crossbar in particular, and it is thereby possible to reduce unwanted effects such as electric field distortion and contamination. Further, as indicated by the broken line of FIG. 4, it is possible to pass the beam 1 in a similar way on a different beam introduction path (lower side of FIG. 4). Thus, it is possible to cause convergence of a plurality of beams to an arc form based on a number of crossbar divisions and area of the opening. Further, it is also possible to provide electrode support using the crossbar structure located far away from the beam 1 on the lower side of FIG. 4, and thereby reduce the adverse effects of the crossbar structure. In another example of an electrode supporting method, the supporting body 3 of the axial electrode 2 is split into frame shapes which are inserted from outside the lens, thereby allowing exchange and mechanical axis adjustment.

Figure 5:
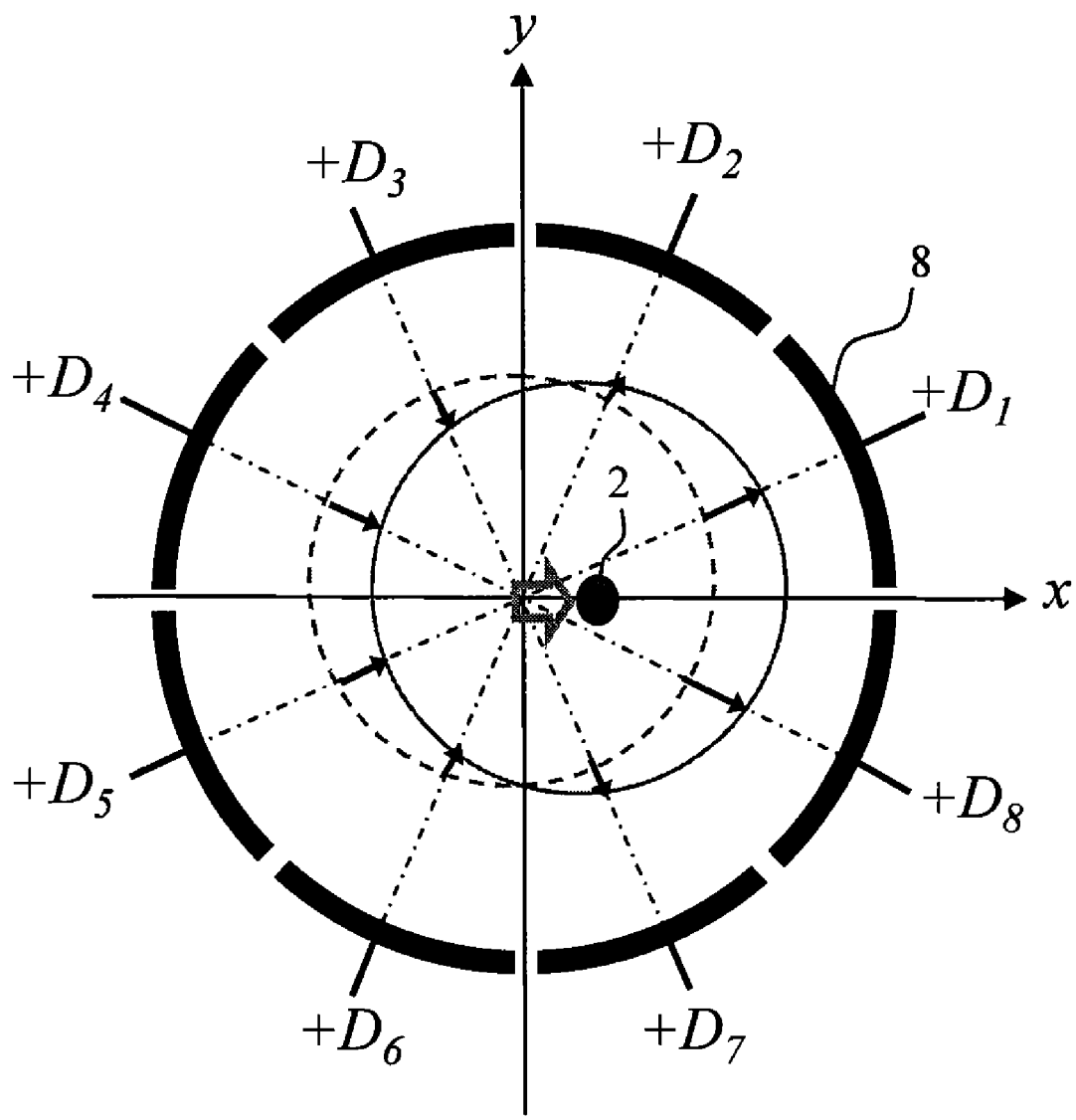
FIG. 5 is a view showing an example of correction by a multipole electrode.

Since the internal portion of the electrodes of the optical system has full rotational symmetry, precise fabrication and construction are comparatively simple. However, when the beams are to be accurately converged, greater precision is required in beam trajectories, displacements between the cores of the axial electrode and the off-axis electrodes, and fabrication. As a measure meet this requirement, the correction of the beam trajectories can be performed by placing an aligning deflector on the incident side of the correcting optical system. The displacement between electrode cores, which is present when the centers of the axial electrode 2 and the off-axis electrode 4 are offset, can be effectively corrected by dividing the off-axis electrodes to form a multipole system. FIG. 5 is a plan view of the octa-poles 8 resulting from equal division in a rotation direction. The circular surface of equal potential generated when the same voltage value is uni-directionally applied as each electrode voltage Dn (where n=1, 2, 3, . . . 8) is shown with a broken line. Here, by adjusting Dn, it is desirable that the surface of equal potential shown with the broken line can be moved to the circular surface of equal potential which is shown by the solid line and has an axis which matches the axial electrode 2 which offset in the X-axis direction.

As is clear from the symmetry of FIG. 5, voltage addition is performed so that correcting voltage Dx is given by:

$$D_1=D_8=Dx, D_2=D_7=aDx,$$

$$D_3=D_6=-aDx, D_4=D_5=-Dx \quad (3)$$

Note that the correction coefficient "a" depends on the form of the electrodes. Here, in the general case in which there is also an offset in the y-axis direction, Dx is replaced with Dy and the addition is performed after rotating the relationships of Formula (3) by 90 degrees.

When astigmatism occurs due to some unspecified effect, correction is possible by adding the mutually reversed voltages Ds and Dt which are given by $$D_1=D_5=Ds, D_3=D_7=-Ds,$$

$$D_2=D_6=Dt, D_4=D_8=-Dt \quad (4)$$

Correction is also possible when the magnetic field coil is arranged to have octa-poles. Moreover, it is possible to correct higher order astigmatism by adding more poles.

Configuration of Electron Lens System for Simultaneous Reduction of Spherical Aberration and Chromatic Aberration In conventional electron lens systems, energy scattering of the incident electrons results in chromatic aberration (i.e. differences in convergent sensitivity) which increases beam defocusing. For instance, a normal electron lens has smaller convergent angle for higher energy electrons, and chromatic aberration is generated as a result of this different sensitivity.

On the other hand, coaxial electric field correctors change the deflection direction according to the divergence and convergence conditions, and systems which include the coaxial correction electrodes can, in principle, have both positive and negative values of chromatic aberration coefficient. Generally, in the field of optics, it is necessary to combine both positive and negative lenses (i.e. concave and convex lenses) to correct chromatic aberration. With the configuration of the example shown in FIG. 3, if the field of the magnetic lens 7 is superimposed with the correction electrodes working as a diverging lens, it is possible to change the trajectories according to the difference in energies, and thereby correct the chromatic aberration. However, in the example of the FIG. 3, the correction electrodes cause the beam trajectory in proximity to the axis to form an image in an upstream position. Thus, if a diverging lens is used under these circumstances without further correction, the trajectory in proximity to the axis will curve outwards, causing an increase in the spherical aberration.

Figure 6:
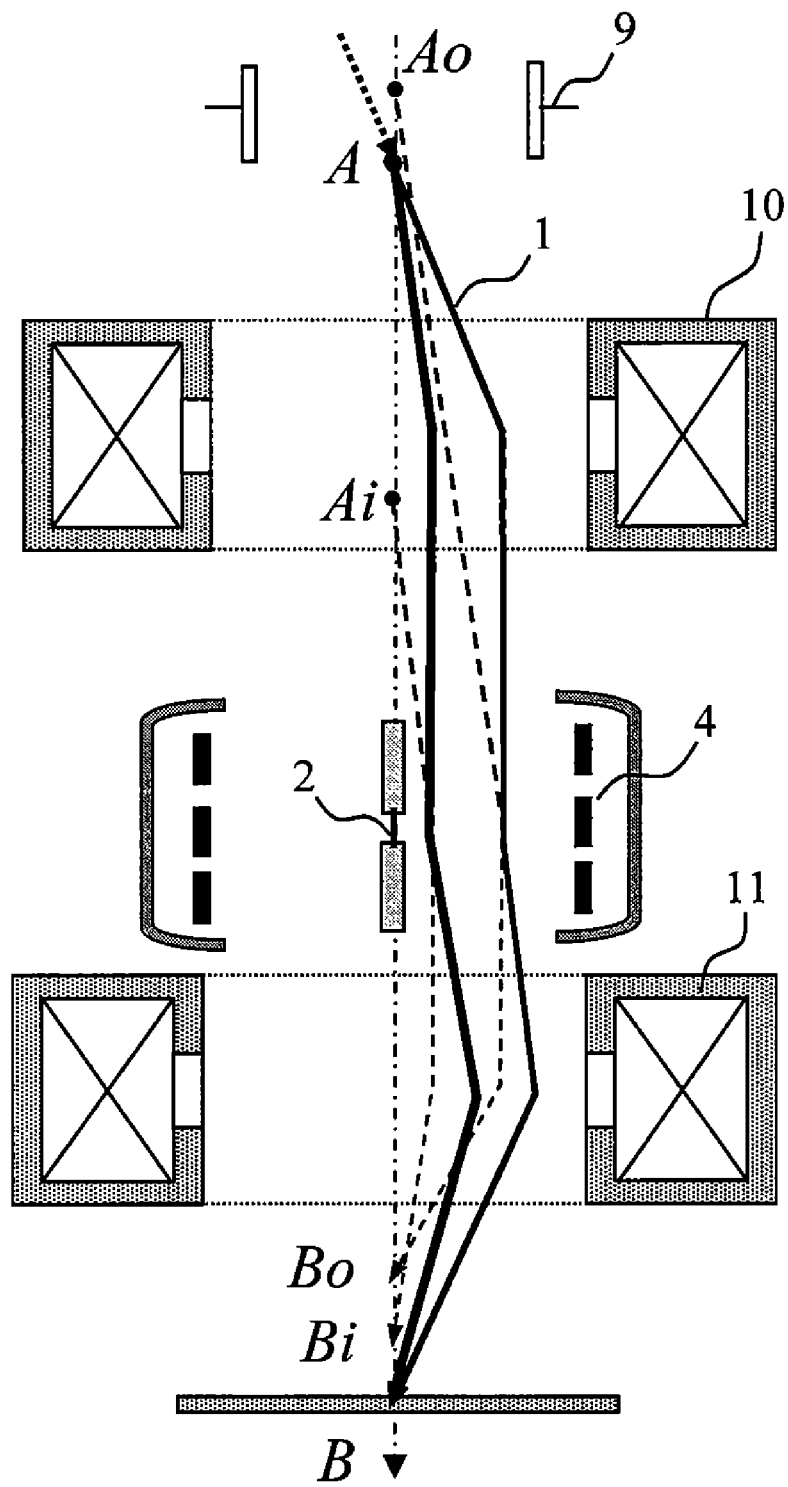
FIG. 6 is a view showing an example of correction of chromatic and spherical aberrations using a divergence condition, according to the embodiment.

For the reasons described above, FIG. 6 shows an example of the use of correctors with divergent conditions in a two-stage combining lens system in order to simultaneously reduce spherical aberration and chromatic aberration. An incident lens 10 adjusts incident angles to the correction electrodes (i.e. the axial electrode 2 and the off-axis electrodes 4) of the electron beam 1 emitted from the object point "A". Here, the incident beam 1 and the correction electrodes are parallel, and the near-axis side and external-side trajectories of the beam 1 are shown. When trajectories of beam 1 are set to diverging direction using the axial electrode 2 and the off-axis electrodes 4, the near-axis side and external side electrons are seen by an objective lens 11 to have been emitted from Ai and Ao respectively. Thus, from the lens formula, the near-axis side trajectory on the image forming side of the objective lens 11 moves towards the objective lens side, the off-axis trajectory moves away from the objective lens 11. It is therefore possible to reverse deflections of the spherical aberration and cause the trajectories to converge at point "B". Further, it is possible to cancel out the chromatic aberration by making use of the diverging effect of the electric field corrector and the converging effects of the objective lens 11. Further, a two-stage incident lens 10 and objective lens 11 can be used in a configuration in which they does not superimpose a corrector. An electrostatic lens can also be used. Here, in the configuration shown in FIG. 6, it is important to control the angle of incidence of beam 1. Through placement of the center of an illumination deflector 9 for trajectory correction at an object point position of the incident lens 10, it is possible to perform adjustments without moving the object point position.

Note that when spherical aberration alone is to be corrected, a configuration in which the axial electrode 2 and the off-axis electrodes 4 are combined with the objective lens 11 (see FIG. 3) may be used. However, when the chromatic aberration is to be simultaneously corrected, it is preferable that the axial electrode 2 and the off-axis electrodes 4 are not combined with the objective lens 11 and have a configuration of the type shown in FIG. 6.

Configuration of Multifunctional Optical System

Figure 7:
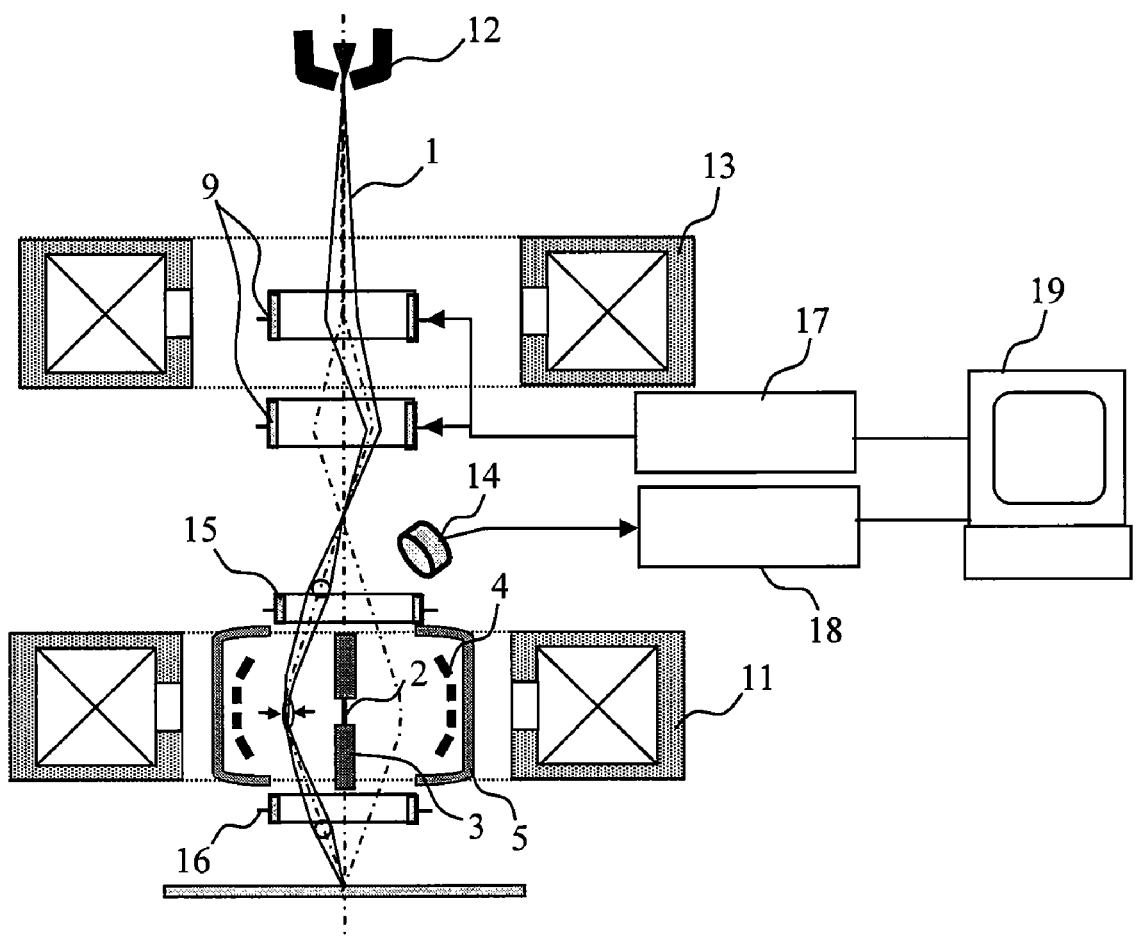
FIG. 7 is a view showing an example of the corrector being used in a 3-dimensional observation SEM.
Figure 8:
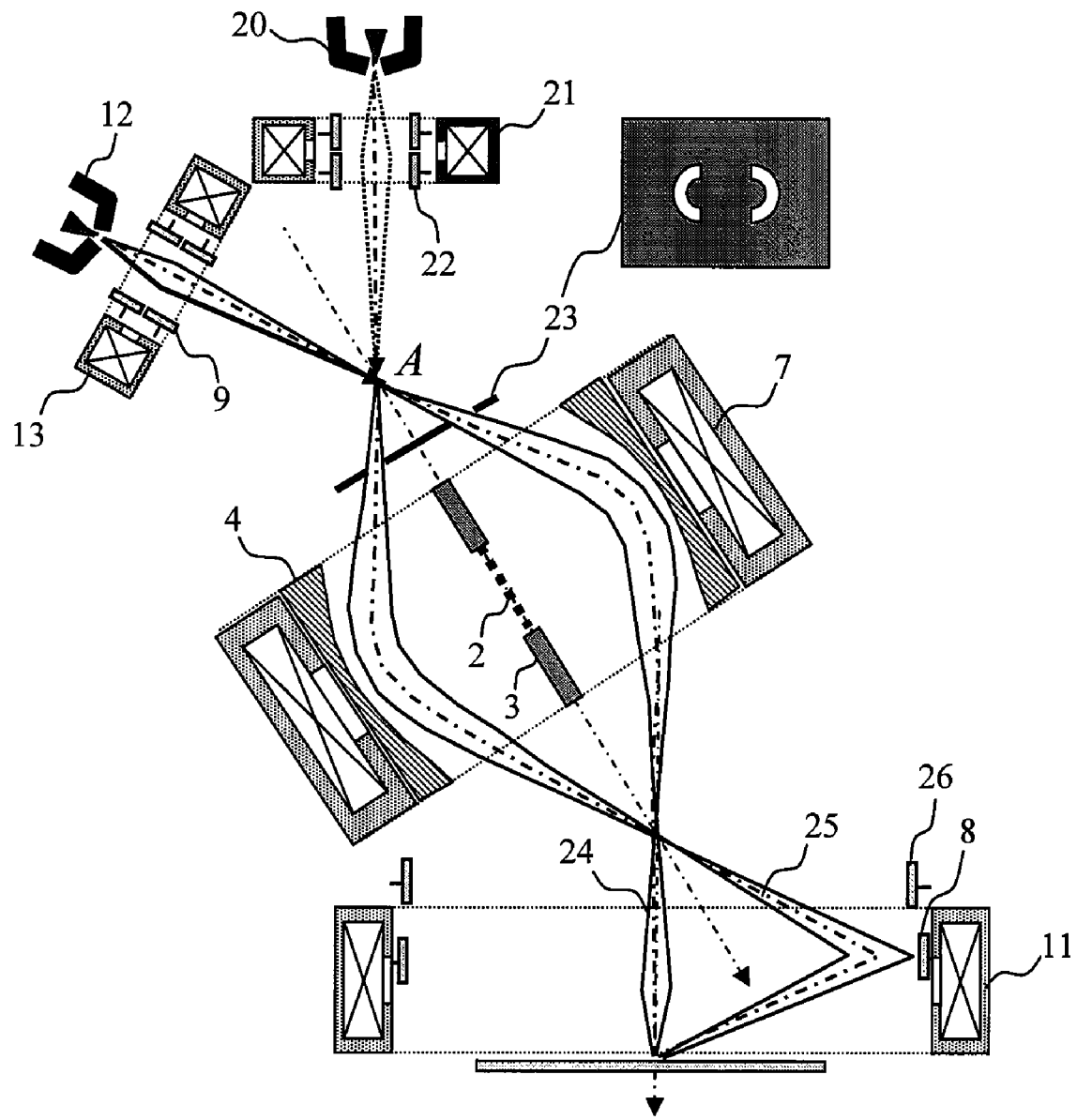
FIG. 8 is a view showing an example of the corrector being used in a multi-beam configuration.

In recent years, the requirements for charged particle beam optical system have diversified including 3-dimensional observation based on oblique observation from multiple directions. FIG. 7 and FIG. 8 are schematic diagrams showing examples of multifunctional electron optical systems which combine the electric field-type corrector of the invention and a deflecting aberration correction system.

(1) According to the embodiment of the invention, the bi-directional beam irradiation system shown FIG. 7 can be provided. In the system of FIG. 7, the beam 1 emitted from an electron source 12 is caused to form an image on the correction electrode axis by an illumination lens 13. The image formation position and angle are adjusted using the two-stage illumination deflector 9. An objective lens (magnetic lens) 11 produces a pre-correction curved basic trajectory, and forms an image of a substantially obliquely incident beam at a desired position. Further, through the action of the axial electrode 2 supported by the supporting body 3 in the objective lens 11 (magnetic lens), the corrected trajectory forms an image on the axis downstream of the electrodes.

Here, the deflected signal superimposed in the illumination deflector 9 by a deflector circuit 17 is used to 2-dimensionally scan a correction electrode incident surface. A reflected electron signal detected by a detector 14 is passed through a signal processing circuit 18, and a scan image is synchronously constructed on an image display apparatus 19. From this position information it is possible to perform axial adjustments. In this state, with a small deflection superimposed at the illumination deflector 9, it is possible to 2-dimensionally scan the specimen surface and construct a scan image from the reflected electron signal detected by the detector 14. Thus, it is possible to easily perform axially adjustments by minimizing an amount of displacement of an opening portion of a corrector upper portion image obtained from the scan image and minimizing distortion in the image of the specimen surface.

With regard to adjustment of the illumination deflector 9, image defocusing can be lessened and adjustments can be facilitated by finding the focal point sensitivity of one of the electrodes in advance, and performing integrated control of the electrode. Thus, an incident position to the correction electrodes changes according to an output of the illumination deflector 9, and the conditions for convergence are not longer present. In this case, a linear relationship between an amount of focus blurring and a correction amount of the correction electrodes is found in advance based on an input signal to the illumination deflector 9 and fed back to the correction electrode to enable automatic correction. If the range deflection is very small, it is possible to find, in advance, scan image distortion amounts and defocusing amounts on the specimen surface with respect to a plurality of input values to the illumination deflector 9 and to approximate the results as a perturbation polynomial function using a least squares method. By setting the minimum value of the function, the incident conditions can be optimized.

In charged particle optics, the magnetic-field type objective lens 11 has a focal point position and characteristics of beam-deflecting the rotation/convergent directions of the off-axis beam 1 according to an amount of excitation. As a result, a position displacement to a characteristic focal point is also generated for the correction electrode according to the arrangement thereof. When a 3-dimensional focal point position (x, y, z) is considered, action amounts ($dx_i$, $dy_i$, $dz_i$) of three off-axis electrodes (corrector) of, for instance, the four off-axis electrodes in FIG. 3 are added.

$$dx_1 + dx_2 + dx_3 = x$$

$$dy_1 + dy_2 + dy_3 = y$$

$$dz_1 + dz_2 + dz_3 = z \qquad (5)$$

From Formula (5), it is clear that 2-dimensional (x, y) scanning while performing a certain degree of dynamic correction of the focal point can be performed using only the correction electrodes in the magnetic field.

In the configuration of FIG. 7, since a rotation direction component of the beam 1 within the off-axis electrode 4 converges without aberration for reasons of symmetry, off-axis scattering, which is radial direction scattering, becomes a problem. Hence, by causing the trajectories in the radial direction to converge in advance within the off-axis electrode groups 4, it is possible to obtain an improved correction effect. For instance, if the positive and negative voltages of the same value are applied to opposing electrodes of the octa-poles 8 shown in FIG. 5 to be an astigmatism corrector, it is possible to apply converging and diverging effects to the passing beam. In the configuration of FIG. 7 specifically, such incident astigmatism corrector 15 is positioned before the corrector, the trajectories converge in the substantially radial direction, and diverge in a direction perpendicular to the radial direction (i.e. the rotation direction). Further, an exit astigmatism corrector 16 is placed after the corrector, and has an effect directly opposite to that of the beam incident astigmatism corrector on the incident side. With this arrangement, it is possible to improve the aberration correction effects.

Note that, by placing the detector 14 in an upper portion of the correcting optical system, images in proximity to the correction electrodes can be acquired. Consequently, it is possible to find where the beam 1 should be introduced to the correcting optical system.

(2) According to the embodiment of the invention, it is possible to mix of electron trajectories of the integrated system shown in FIG. 8. In FIG. 8, scale has been ignored for the purposes of illustration. For instance, the dimensions of the correction electrodes in the center of FIG. 8 can be expected to be extremely small due to the high sensitivity of action shown in FIG. 1.

In FIG. 8, beams emitted from a first electron source 12 and a second electron source 20 form an image on a correction electrode axis as a result of the action of a first illumination lens 13 and a second illumination lens 21. Position displacement and angle displacement in the image formation are adjusted by a first illumination deflector 9 and a second illumination deflector 22. Here too, an axial electrode 2 which is supported by a supporting body 3 in the magnetic lens 7 and off-axis electrodes 4 act to form an image on the axis downstream of the electrodes. In this state, a perpendicularly incident beam 24 and an obliquely incident beam 25 in FIG. 8 can form an image of the specimen surface or like via an objective deflector 26 and the objective lens 11. Hence, it is possible to mix beams from different sources.

In FIG. 8, the off-axis electrodes 4 are provided in proximity to the beam and the forms of the off-axis electrodes 4 is optimized to control the trajectories. Thus, fringe portions of the off-axis electrodes 4 generate high-order distortion. However, under this way of thinking is that incident angle to the electrodes is suppressed, the electrodes are lengthened, and the resulting controllability is used. Thus, in contrast to the configuration in FIG. 7, the electric field generated in proximity to the axis by the plurality of axial electrode groups 2 is controlled, to control the trajectories. Further, in the configuration of FIG. 8, since the obliquely incident beam 25 passes off-axis of the objective lens 11, a large deflection aberration occurs. However, by arranging the multiple poles shown in FIG. 5 and adjusting the distribution, it is possible to greatly reduce the aberration.

With the configuration of FIG. 8, as with the configuration of FIG. 7, it is possible to obtain a larger correcting effect by converging, in advance, the trajectories in the radial direction within the off-axis electrodes 4. In the configuration of FIG. 8, a movable limiting aperture 23 (which changes a form of an aperture in the radial direction and the rotation direction) is placed on the incident side, and the radial direction trajectory of the beams are limited. The result is an arc opening which captures more perpendicular direction trajectories, which is to say rotation direction trajectories. With this arrangement, it is possible to improve the aberration correction effects. When a switch to a plurality of charged particles is desired in the configuration in FIG. 8, the beams can be separately blanked from the limiting aperture 23 of the correction electrode upper portion using the first illumination deflector and 9 and the second illumination deflector 22.

SUMMARY

Being extremely simple and compact in comparison to conventional aberration correctors, the charged particle beam trajectory corrector according to the invention is, from the point of view of implementation and cost reduction, of great use in scanning electron microscopes and transmission electron microscopes. Further, the charged particle beam trajectory corrector is characterized by a simple structure which easily miniaturized through use of MEMS techniques or the like, and may be included with ease in the multi-beam systems which have been receiving a great deal of attention in recent years.

Further, according to the present embodiment, since a configuration which compounds the corrector and a magnetic lens is possible, the overall length of the optical system can be shortened in comparison to conventional multi-stage multipole correction system, and the influence of external disturbances can be reduced. Moreover, a reliable system construction with a surrounding magnetic shield and the like that are easily provided and excellent anti-vibration/anti-noise/spatial properties can be provided (see the configurations of FIG. 6 to FIG. 8).

Further, according to the present embodiment (FIG. 6 to FIG. 8), since there is no need to use a multipole electrode, it is possible to reduce the number of electrodes by a factor of approximately ten in comparison to multi-stage multipole correction system, and thereby greatly reduce the number of corresponding power sources. This reduction gives the present embodiment the advantage of a large reduction in cost.

Further, since the bright central beam which can cause problems in annular illumination methods is not excluded, the obtained beam current is large and axial adjustment is simple. Also, there is advantage from the point of view of stability in that because the beam incident range is limited, the beam does not directly illuminate the correction electrodes or the like, and contamination deposition is small.

The correction system overall is a rotationally symmetrical system, and it is therefore easy to analyze the trajectory magnetic/electric fields and calculate trajectories. Further, there are advantages relating to manufacture. Since the charged particle beam trajectory corrector can be mechanically fabricated and assembled with accuracy and has a high correction sensitivity, miniaturization is possible. Moreover, the number of electrodes in the configuration and thus the number of power sources is reduced, making it easy to realize cost savings.

What is claimed is:

1. A charged particle beam trajectory corrector for modifying trajectories of charged particle beams to correct aberrations, comprising:
   a correction electrode group including an axial electrode provided on a straight-line axis which obliquely crosses an emission axis of a charged particle beam from an illumination lens and off-axis electrodes provided with rotational symmetry so as to surround the axial electrode; and,
   a magnetic lens which generates an electric field between the axial electrode and the off-axis electrodes, wherein the charged particle beam is caused to obliquely intersect the straight-line axis, a voltage is applied between the axial electrode and the off-axis electrodes to relax electric field distortion, and the aberration is corrected by an action of the magnetic lens.

2. The charged particle beam trajectory corrector according to claim 1, wherein an intersection point between the emission axis of the charged particle beam and the straight-line axis matches an image-formation point of the illumination lens.

3. The charged particle beam trajectory corrector according to claim 1, wherein the off-axis electrodes are configured as an off-axis electrode group which includes a plurality of off-axis electrodes, and voltage values proportional to a voltage input value to a predetermined off-axis electrode of the plurality of off-axis electrodes are inputted to the other off-axis electrodes of the plurality of off-axis electrodes.

4. The charged particle beam trajectory corrector according to claim 1, wherein the magnetic lens is compounded so as to be a rotational symmetry that is coaxial with the straight-line axis on which the axial electrode of the correction electrodes is provided.

5. The charged particle beam trajectory corrector according to claim 1, wherein input values of the correction electrodes are controlled with a linear function of input values to the magnetic lens.

6. The charged particle beam trajectory corrector according to claim 1, further comprising:
   a supporting body to which is fixed one end of the axial electrode and the off-axis electrodes, wherein
   the axial electrode is configured as a short rod-like electrode or a substantially point-like electrode surrounded by a ground-connected shield electrode, and the supporting body has an annular opening which limits an incident range of the charged particle beam to a periphery of a portion fixed to an end of the rod-like electrode.

7. The charged particle beam trajectory corrector according to claim 1, wherein the off-axis electrodes are divided in a circumferential direction to form a plurality of portion electrodes, and voltages are independently applied to the each portion electrode.

8. The charged particle beam trajectory corrector according to claim 1, further comprising:
a movable limiting aperture having differing opening dimensions in a radial direction and a rotation direction from a center of an axis of rotational symmetry of the off-axis electrodes.

9. The charged particle beam trajectory corrector according to claim 1, further comprising:
an incident astigmatism corrector for correcting convergence towards a radial direction and a rotation direction from a center of an axis of rotational symmetry of an incident charged particle beam; and
an exit astigmatism corrector which restores a shape of the charged particle beam emitted from the correction electrodes.

10. A charged particle beam apparatus which illuminates a specimen with a charged particle beam and acquires a specimen image, comprising:
a charged particle source which generates the charged particle beam;
an illumination lens for converging the charged particle beam;
a charged particle beam trajectory corrector for modifying a trajectory of the charged particle beam to correct aberration;
an illumination deflector for illuminating the specimen with a modified-trajectory charged particle beam; and
an image generating and processing unit which detects a reflected electron signal from the specimen and displays an image on an image display apparatus, wherein
the charged particle beam trajectory corrector includes: a correction electrode group including an axial electrode provided on a straight-line axis which obliquely crosses an emission axis of the charged particle beam from the illumination lens, and off-axis electrodes provided with rotational symmetry so as to surround the axial electrode; and a magnetic lens which generates an electric field between the axial electrode and the off-axis electrodes, and
the charged particle beam is caused to obliquely intersect the straight-line axis, a voltage is applied between the axial electrode and the off-axis electrodes to relax electric field distortion, and the aberration is corrected by an action of the magnetic lens.

11. The charged particle beam apparatus according to claim 10, wherein the illumination deflector corrects an incident direction of the charged particle beam.

12. The charged particle beam apparatus according to claim 10, wherein
the illumination deflector further includes a function for scanning an upper structure of the correction electrodes, and
the image generating and processing unit detects a reflected electron signal from the upper structure of the correction electrodes, generates images of the upper structure of the correction electrodes, and displays the images on the image display apparatus.

13. The charged particle beam apparatus according to claim 10, further comprising:
a control unit which controls input voltage values of the correction electrodes with a linear function of input to the illumination deflector.

14. The charged particle beam apparatus according to claim 10, further comprising:
a control unit which controls the illumination deflector by measuring shape distortion of an emission beam with respect to a plurality of input values to the illumination deflector, approximating the distortion amounts as a polynomial function, and computing from the polynomial function an input value to the illumination deflector to minimize the distortion amount.

* * * * *